(12) United States Patent
Wise

(10) Patent No.: US 7,315,973 B1
(45) Date of Patent: Jan. 1, 2008

(54) METHOD AND APPARATUS FOR CHOOSING TESTS FOR SIMULATION AND ASSOCIATED ALGORITHMS AND HIERARCHICAL BIPARTITE GRAPH DATA STRUCTURE

(75) Inventor: Ashley K. Wise, Blaine, MN (US)

(73) Assignee: Unisys Corporation, Blue Bell, PA (US)

( * ) Notice: Subject to any disclaimer, the term of this patent is extended or adjusted under 35 U.S.C. 154(b) by 199 days.

(21) Appl. No.: 11/241,417

(22) Filed: Sep. 30, 2005

(51) Int. Cl.
*G01R 31/28* (2006.01)

(52) U.S. Cl. ............ 714/741; 714/724; 714/739; 714/25; 714/32; 703/14

(58) Field of Classification Search .......... None
See application file for complete search history.

(56) References Cited

U.S. PATENT DOCUMENTS

| | | | |
|---|---|---|---|
| 5,546,562 A * | 8/1996 | Patel ..................... | 703/14 |
| 5,719,881 A * | 2/1998 | Yonetoku ................ | 714/25 |
| 5,771,243 A * | 6/1998 | Lee et al. ............... | 714/738 |
| 5,996,101 A * | 11/1999 | Masumoto .............. | 714/738 |
| 7,007,251 B2 * | 2/2006 | Hekmatpour ............ | 716/4 |
| 7,162,674 B2 * | 1/2007 | Nozuyama .............. | 714/741 |
| 2004/0059977 A1 * | 3/2004 | Liau ..................... | 714/741 |

\* cited by examiner

*Primary Examiner*—John P Trimmings
(74) *Attorney, Agent, or Firm*—Charles A. Johnson; Robert Marley; Nawrucki, Rooney, & Sivertson

(57) ABSTRACT

An apparatus for and method of generating test cases for testing simulated logic circuit designs. The test cases are basically generated automatically in a random fashion, manually, or using some combination of automatic and manual techniques. Each test case has a corresponding success indication. These test cases are provided to the simulated logic design for execution. Following execution, each test case is rated pass or fail by comparison of the result with the corresponding success indication and a reason for failure is recorded for each failure. A significantly smaller list of test cases is prepared by eliminating test cases which do not have a unique reason for failure. The smaller list of test cases is then presented for a simulation run which requires substantially less simulator time and substantially less manual analysis of the results.

20 Claims, 13 Drawing Sheets

METHOD AND APPARATUS FOR CHOOSING TESTS FOR SIMULATION AND ASSOCIATED ALGORITHMS AND HIERARCHICAL BIPARTITE GRAPH DATA STRUCTURE

BACKGROUND OF THE INVENTION

1. Field of the Invention

The present invention generally relates to methods and apparatus for testing digital electronic circuit designs and more particularly employing techniques for selection of test cases for use on simulated logic designs to improve efficiency of test operation.

2. Description of the Prior Art

The earliest digital circuit designs were constructed in prototype form and tested using actual electronic inputs and outputs. Errors measured using this process were then physically corrected in the prototype and the system retested electronically. This approach is suitable only for the simplest of designs and becomes increasingly more costly to employ with increasing design complexity. Furthermore, it is questionable whether this approach could even be implemented with the highly integrated nature of current designs.

The current approaches tend to be based upon simulation of a digital circuit design. According to this technique, software tools are utilized to simulate the structure and operation of a logic circuit. Should an error be found, a design change can be made through a simple change to the simulation data base. After the design is finalized, other software tools can automatically or semi-automatically document the circuit design and assist in implementation with a plotter or other output device. Because finalized designs are typically stored for future use, complete designs and portions thereof can be easily referenced for use in future designs. As a result, commonly used components (e.g., registers, accumulators, etc.) are saved within readily accessible libraries. In this way, very complex circuits can be designed with a minimal amount of effort.

With the widespread use of such software design tools (i.e., simulators, etc.), a key problem becomes testing of the simulated design. Testing of so-called combinational logic is relatively straightforward. However, virtually all designs which are commercially useful have various sequential state saving elements (e.g., flip-flops, registers, etc.). The most complex of current designs, such as instruction processors, having literally tens of thousands of gates are substantially more complex than simple logic trees. Thus, testing of such designs is a formidable problem.

The design of tests to determine proper operation of a simulated or emulated design becomes a major design problem in itself. At the highest level, manual design of test conditions tends to be relatively expensive to prepare, because of the engineering time involved, but relatively efficient to run, because the intelligence employed in the test design tends to focus on the most significant test cases.

Totally random tests, on the other hand, tend to be inexpensive to develop, because of the automatic preparation, but relatively inefficient to run, because truly random tests tend to employ many test cases which correspond to a single logic error. Whether randomly or manually generated, many test cases which point to the same logic error tend to waste simulation run time and error result analysis time because of these redundant test case.

SUMMARY OF THE INVENTION

The present invention overcomes the disadvantages found in the prior art techniques of test development by employing a "test picker" which assumes that for a given logic error in a design under test (DUT), there will be many tests that manifest a similar failure, because in practice, similar failures are often the result of the same problem. In accordance with the present invention, instead of re-running the many tests to identify that single problem thus wasting resources, a single test or very small group of tests is utilized to identify that problem. As a result, the design engineers' time to manually parse through all the redundant failures and pick the ones worth pursuing is thereby minimized. For a given period of time, the designers are able to consider a larger number of different logic errors.

In accordance with the present invention, a test is a specific instance of initial DUT parameters, an associated list of instructions and data, and a set of conditions that must be met to determine successful execution. Instructions with their data are executed serially on a single DUT module and in parallel on multiple DUT modules A success condition may be violated anywhere during the execution of a test, and in such a case the test does not Pass, but rather Fails.

A Failure is one result of the execution of a Test. It is reported using the information of whether the test passed or failed, and if it failed, details of why it failed, including categorized details of each success condition that was violated. Passing tests are optionally stored alongside failing tests in the data base, and for simplicity, "pass" is categorized as a special case of a failure.

Sometimes, a test is referred to more specifically as a Test/Stress pair or combination, where Test is just the instructions and data and a subset of success conditions. Stress is the initial parameters and a subset of success conditions. There are additional success conditions that are an intrinsic part of the DUT and are common to all tests unless disabled by a Stress.

The TestPicker Suite is a set of tools designed to manage the past history of tests and their pass/fail information. It also collects sets of test based on the corresponding histories.

The "hierarchical bipartite graph" (HBG) data structure is used to model the relationship between the Test information and the Failure information. This data structure is the core of the HBG data base (data structure plus access and manipulation algorithms). Multiple tests can exhibit the same failure (often due to triggering the same logic or design bug). Similarly, a single test might exhibit multiple failures (due to being run under multiple revisions of the DUT, or due to triggering multiple design bugs). This pattern leads to a graph structure. The details of the HBG design and implementation make it easy to analyze and obtain information from the data base, and to implement the desired algorithms. In addition, this permits the data base to obtain sets of tests or to partition the tests into categories.

The test picker of the present invention generates lists of tests that are historically dissimilar, resulting in lists that are more likely to find different problems. This differs from past solutions that make no effort to arrange the lists of tests based upon test history. The test picker employs a set of advanced, optimal algorithms for choosing a minimum set of tests that covers a maximum number of failures. Because it is automatically provided, this approach is readily distinguishable form manual hand-picking processes which can take days of engineering time and which do not necessarily result in a minimum number of tests or a maximum number of covered failures.

The data structure of the test data base according to the present invention is called "hierarchy bipartite graph" (HBG). The HBG data base stores all the detailed information of how a test failed, while previous test data bases stored only whether it passed or failed. Unlike just having a large collection of textual "report files" to hold the failure details, HBG allows complex operations to be easily performed to manipulate and access this data.

"Min-Max Picking" is the most important set of HBG algorithms in the TestPicker suite. It performs two basic tasks. First, it chooses minimum sets of tests that cover maximum subsets of failures. Second, it chooses a disjoint set of tests. That means that the tests in the set are historically different (i.e., they passed and failed differently during a past execution). Both of these functions permit extensive testing of the DUT (i.e., coverage of a large number of potential failures) with minimal time an resources (i.e., a relatively small number of test/stress combinations).

Having lists of tests that are historically dissimilar (unlike prior systems), results in finding more DUT logic and design bugs sooner, saving money and design testing time. These savings accrue in test development, because the tests are semi-automatically, rather than manually designed. Further savings are found during test operation, because fewer tests need be run and fewer redundant failures need to be manually examined.

In accordance with the present invention, the specific syntax, usage, and input/output parameters of the various utilities and functions are not important. However, the method, purpose, and existence of the utilities are important. Furthermore, the syntax and format of the "report files" (i.e., test result summaries) and "vertex values" (i.e., design keywords) may vary from application to application. New front-ends may be plugged in to allow the test picker suite to work with any type of report files and vertex values from other projects.

BRIEF DESCRIPTION OF THE DRAWINGS

Other objects of the present invention and many of the attendant advantages of the present invention will be readily appreciated as the same becomes better understood by reference to the following description when considered in connection with the accompanying drawings in which like reference numerals designate like pars throughout the figures thereof and wherein.

DETAILED DESCRIPTION OF THE PREFERRED EMBODIMENTS

The present invention is described in accordance with several preferred embodiments which are to be viewed as illustrative without being limiting. These preferred embodiments are intended to be used with commercially available logic design and simulation systems. Those of skill in the art are familiar with such logic design and simulation systems and will be readily able to integrate the structure and procedures of the present invention with any selected one of these commercially available logic design and simulation systems.

Figure 1:
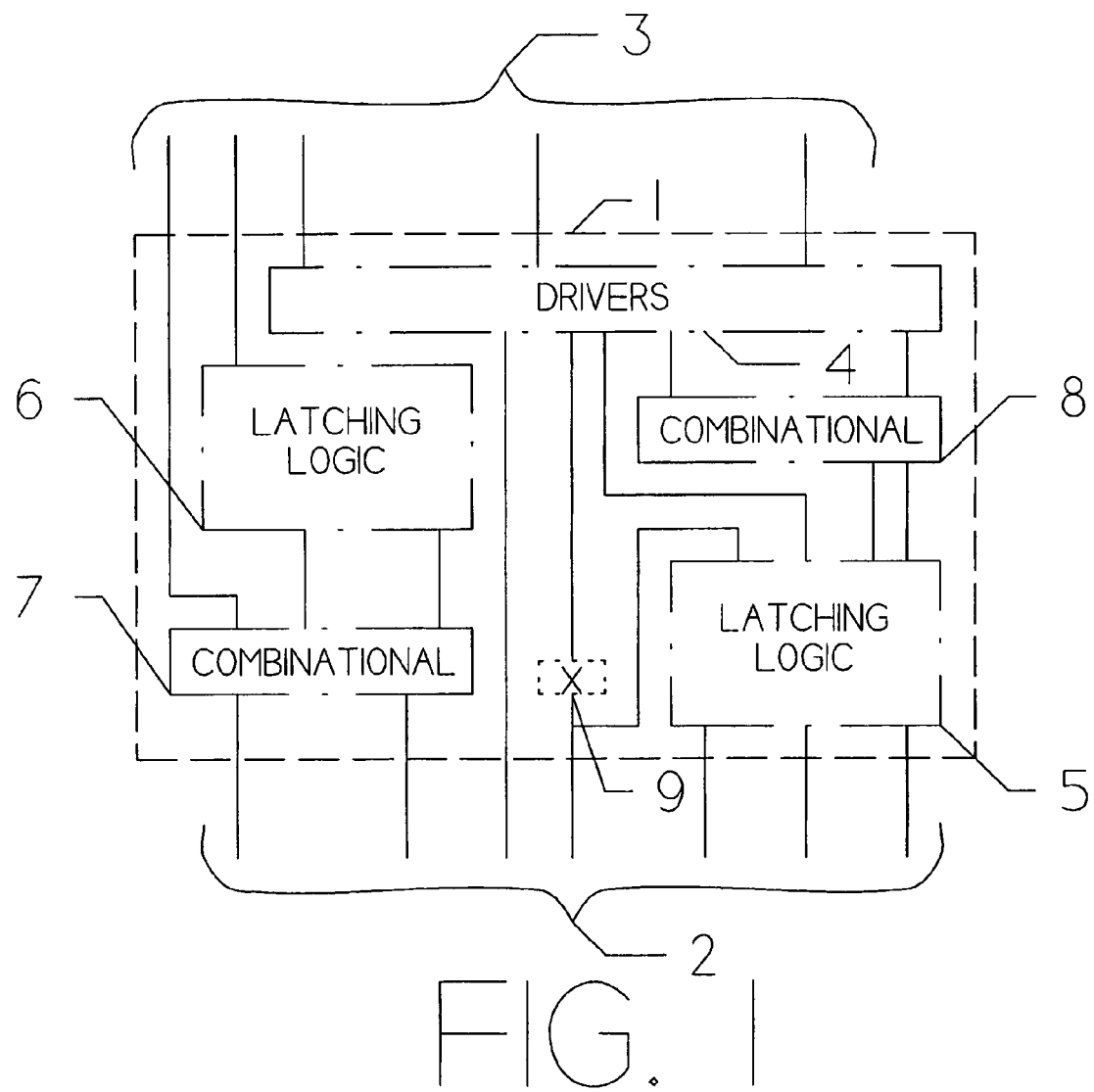
FIG. 1 is a diagram showing a sample digital electronic circuit under design.

FIG. 1 is an illustration of a typical complex logic circuit 1 having inputs 2 and outputs 3. Logic circuit 1 is shown as the physical embodiment of a logic circuit designed, simulated, and tested by a commercially available complex logic circuit design package, of which there are several readily available for purchase in the market place. Those of skill in the art typically choose between such commercially available complex logic circuit packages upon the basis of features, operator interface, flexibility of tools, cost, etc. Typically, logic circuit 1 may comprise some tens of thousands of logic elements (e.g., and gates, or gates, invertors, flip-flops, etc.).

Logic circuit 1 may be a single integrated circuit, a hybrid circuit, a printed circuit module, or other physical package. However, it is important, in accordance with current complex digital logic designs, logic circuit 1 contains drivers 4, latching logic elements 5 and 6, combinational logic elements 7 and 8, and "special logic" 9. Most significant is that logic circuit 1 contains latching logic elements 5 and 6 which store state-based information thereby requiring the testing to be performed to provide for differences in the order of presentation of the various test inputs.

Figure 2:
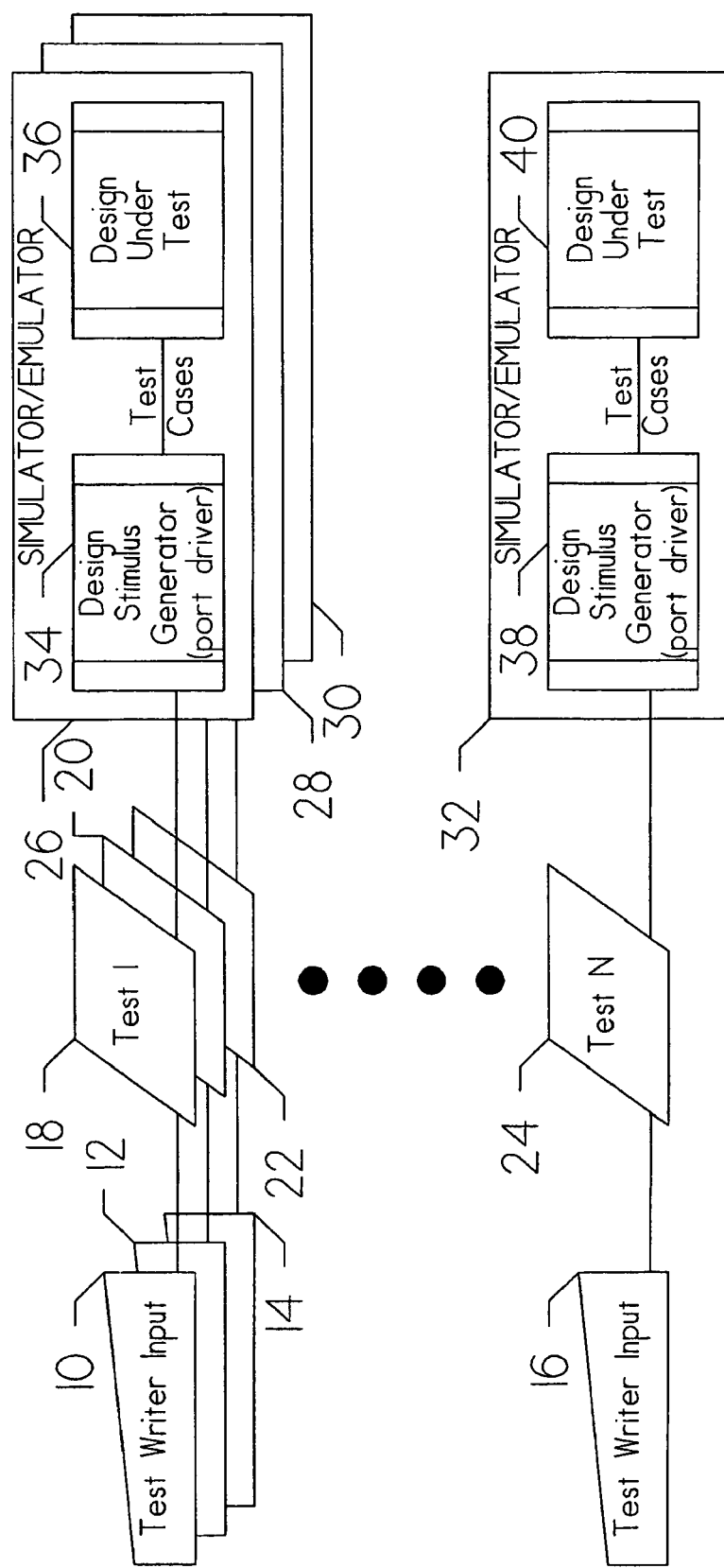
FIG. 2 is a pictographic view of a typical prior art method of test case generation.

FIG. 2 is a pictographic diagram showing one of the typical prior art test generation processes for testing logic circuit 1. An alternative process (not shown) simply involves automated generation of random tests. This approach is primarily theoretical, because it produces so many nonsensical test cases. As a result, totally random test cases tend to utilize an inordinate amount of time to run on the simulated logic design.

The approach shown in FIG. 2 is essentially the manual approach. This technique requires a test writer who is quite familiar with the logic design to be tested. Ordinarily, this technique employs one or more of the circuit designers to design test cases for their own logic design. The input to the process consists of test writer inputs 10, 12, 14, and 16. These are descriptions of the input conditions to be used to implement a particular test case. As can readily be assumed, this approach consumes a considerable amount of high quality designer time to produce these test cases. However, the resulting test cases require far less simulation run time, because of the elimination of meaningless test cases by the test writer. On occasion, manual test writers miss certain important test conditions which are related to unintended, but designed in, operation of the design under test.

Test writer inputs 10, 12, 14, and 16 are formatted to produce tests 1-$n$ (i.e., references 18, 20, 22, and 24), respectively, which are in turn presented to simulator/emulator 26, 28, 30, 32. In practice, there is only one simulator/ emulator, of course. However, because each test case can potentially modify the stored states of the latching logic within logic circuit 1 (i.e., design under test 36 and 40) from latching logic 5 and 6 as explained above, each test case is potentially presented to a "different" simulator/emulator (i.e., the same simulator/emulator having logic circuit 1 with differing stored states) via design stimulus generator (port driver) 34 and 38.

Figure 3A:
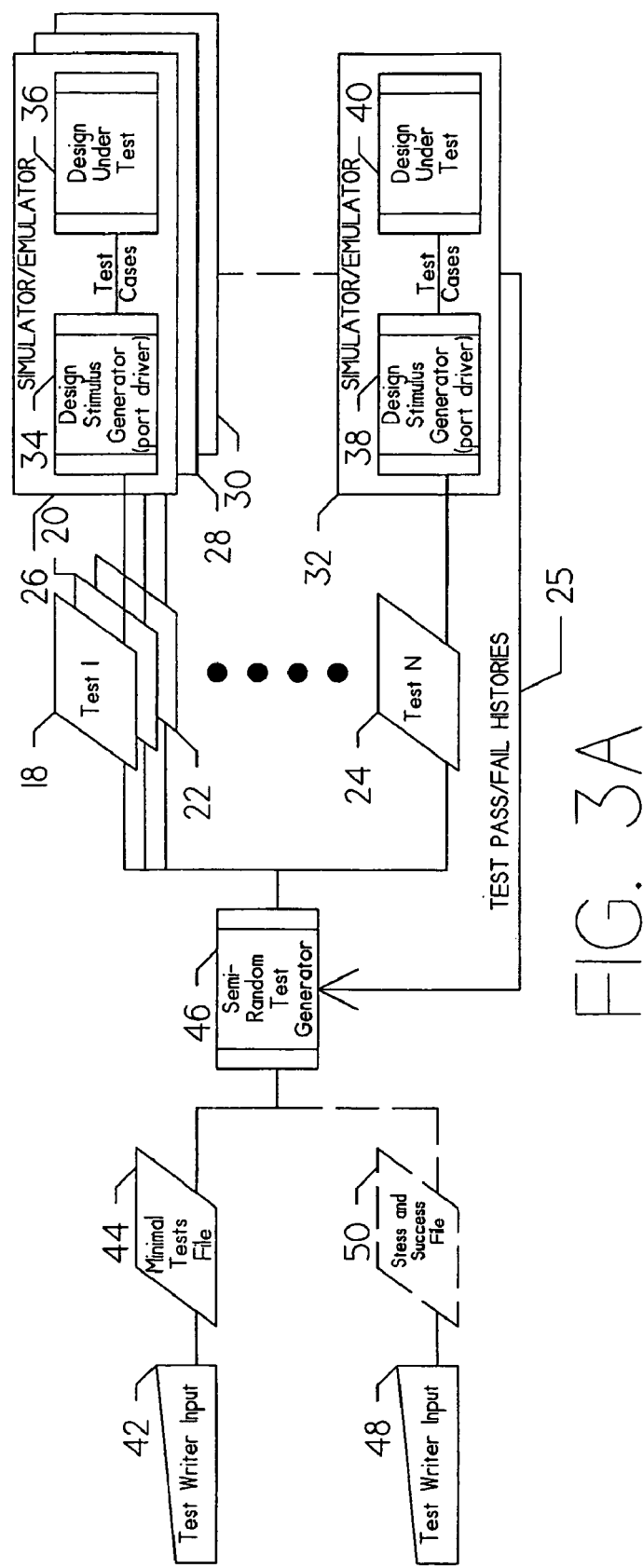
FIG. 3A is an overall pictographic view of the preferred mode of practicing the present invention.

FIG. 3A is a pictographic diagram showing test generation in accordance with the present invention. This process allows projects to reach the goal of rapidly detecting design problems. The technique accomplishes this goal by quickly and easily generating tests that have high variability without needless repetition of test cases having the same or similar failures. Also, finding problems quickly ensures optimal use of simulator/emulator resources.

Unlike the prior art approach (see also FIG. 2), the actual individual test cases (i.e 18, 20, 22, and 24) are generated by the semi-random test generator 46, rather than manually by the test writer. However, unlike a purely random test generator, semi-random test generator 46 receives history information from simulator/emulator 26, 28, 30, and 32 via path 25 in addition to minimal test file 44 of stress and success file 50 received from test writer input 42 and test writer input 44, respectively. This history information is produced from previous use of various test cases. The number of test cases is minimized in accordance with the processes described in detail below to ensure that execution time for succeeding simulations is greatly reduced In other words, each succeeding simulation run is exposed to a number of test cases which is reduced by semi-random test generator 46 eliminating test cases deemed to be redundant. In other words, the approach of the present invention (see FIG. 3) differs from the prior art approach (see FIG. 2) primarily by semi-random test generator 46 which generates semi-random test cases (i.e., 18, 20, 22, and 24) having the number of test cases minimized by redundancies determined from the test result histories of prior simulation runs. The detailed operation of semi-random test generator 46 is explained in detail below.

Figure 3B:
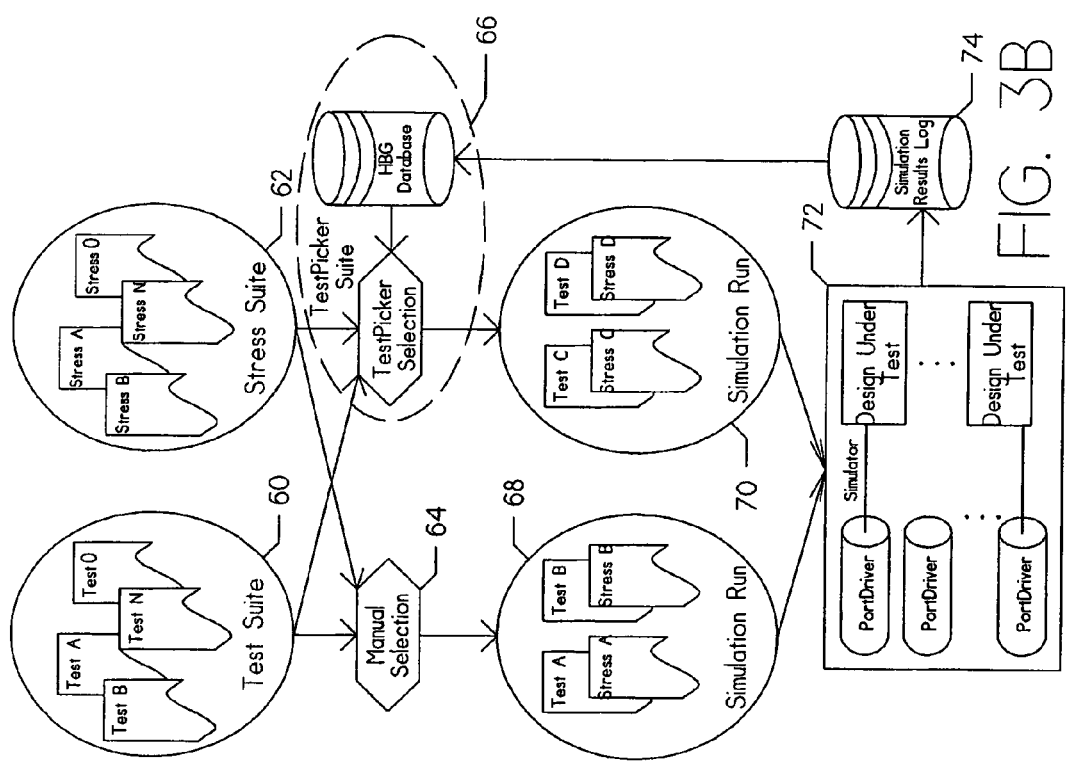
FIG. 3B is a pictographic view of the preferred mode of practicing the present invention with particular emphasis on the "TestPicker"

FIG. 3B is a pictographic diagram showing the details of the "testpicking" process. The process is basically iterative having multiple simulation passes. For the first pass, a first simulation run 68 is prepared from test suite 60 and stress suite 62 using manual selection 64 or other approach such as automatic random generation, semi-random generation, etc. Simulation run 68 is presented to simulator 72 to conduct the first run. The simulation results 74 are extracted and presented to TestPicker Suite 66 for formation of the Hierarchical Bipartite Graph (HBG) as explained in detail below. Using the HBG along with the original test suite 60 and stress suite 62, TestPicker Suite 66 prepares a second, more efficient, simulation run 70. This second simulation run 70 is more efficient, because TestPicker Suite 66 removes many redundant test cases from the previous test case list based upon non-unique results observed during the first simulation pass. It is contemplated that additional iterations are performed in to prepare test case lists for particular testing purposes. The details of the testpicking process and the algorithms utilized are explained below.

Figure 4:
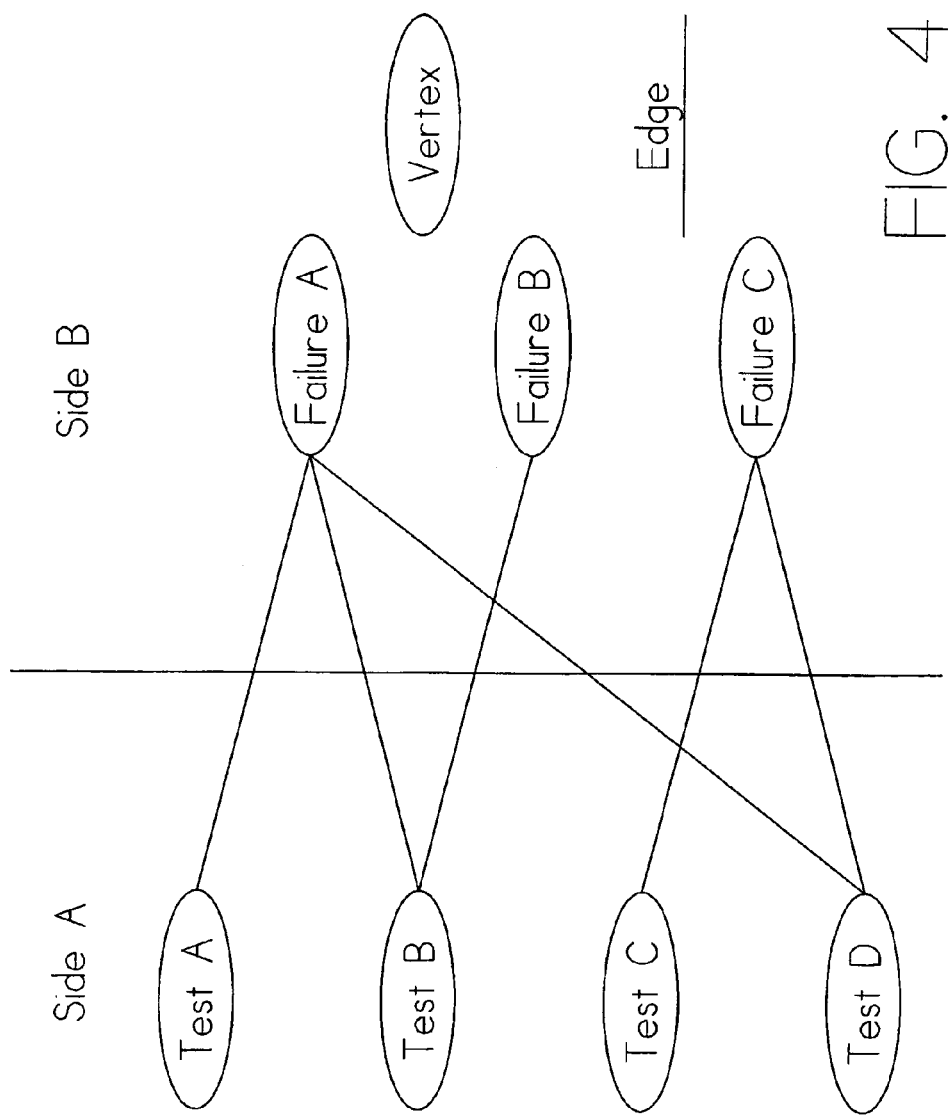
FIG. 4 is a diagram showing the database structure relationships within a Bipartite Graph.

FIG. 4 is a diagram showing a high-level view of the HBG as a simple bipartite graph data base structure. The HBG is bipartite, which means it has two sides with vertices that connect only to vertices on the other side. Sides are referenced by letter "A", "B", and "C", tetrapartite, etc. The current test picker of the present invention only requires two sides (i.e., bipartite). The HBG is a graph, which means it is composed of vertices connected via edges. The HBG is serialized to and from disk as a list of edges. The full graph is constructed in memory only.

Figure 5:
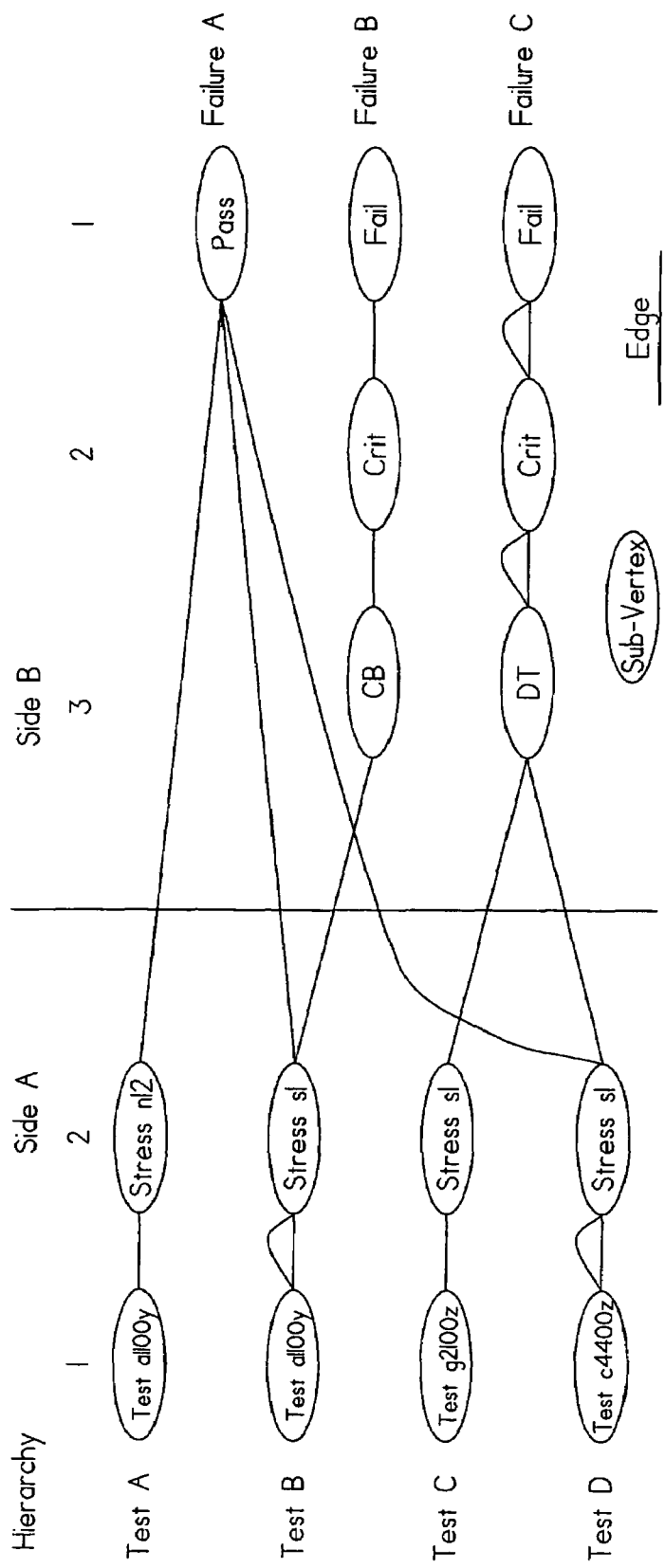
FIG. 5 is a diagram showing the database structure relationships within a Hierarchical Bipartite Graph.

FIG. 5 is a diagram which shows the high-level vertices split into a hierarchy of sub-vertices. The HBG is hierarchical which means that each vertex is actually a hierarchy of sub-vertices. Hierarchy levels are referenced by their side (i.e., "A", "B", etc.) and a number from 1 to N, Hierarchy level 1 is considered the most significant hierarchy. Multiple distinct vertices may share some of the same sub-vertex values. Each complete vertex is in fact a permutation of sub-vertex values.

Figure 6:
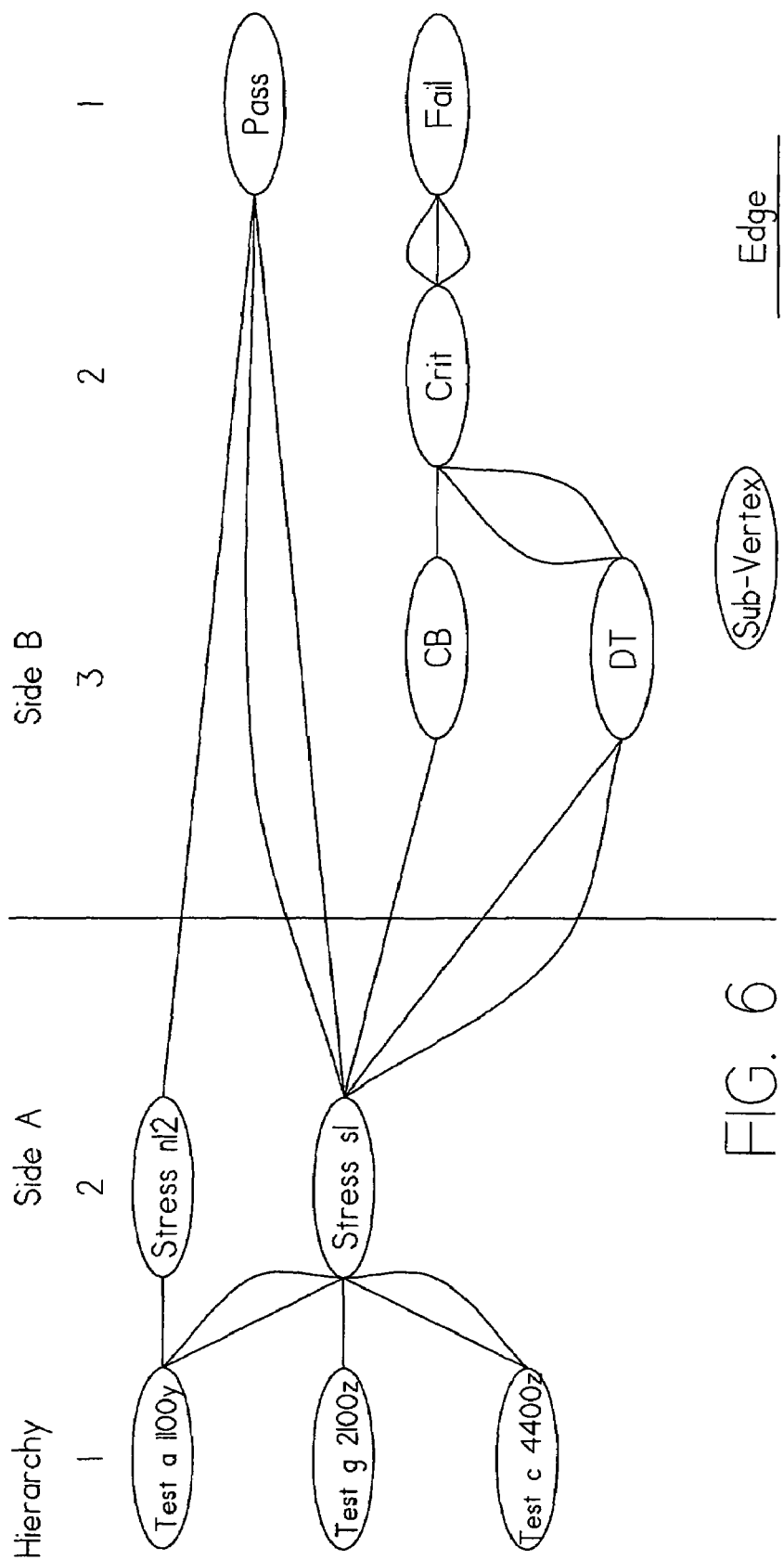
FIG. 6 is a diagram showing Compact Representation.

FIG. 6 is a diagram which shows the compact representation used in the current implementation, where a single sub-vertex is shared among multiple edges. This significantly reduces the size of the graph and significantly simplifies operations on the graph.

Figure 7:
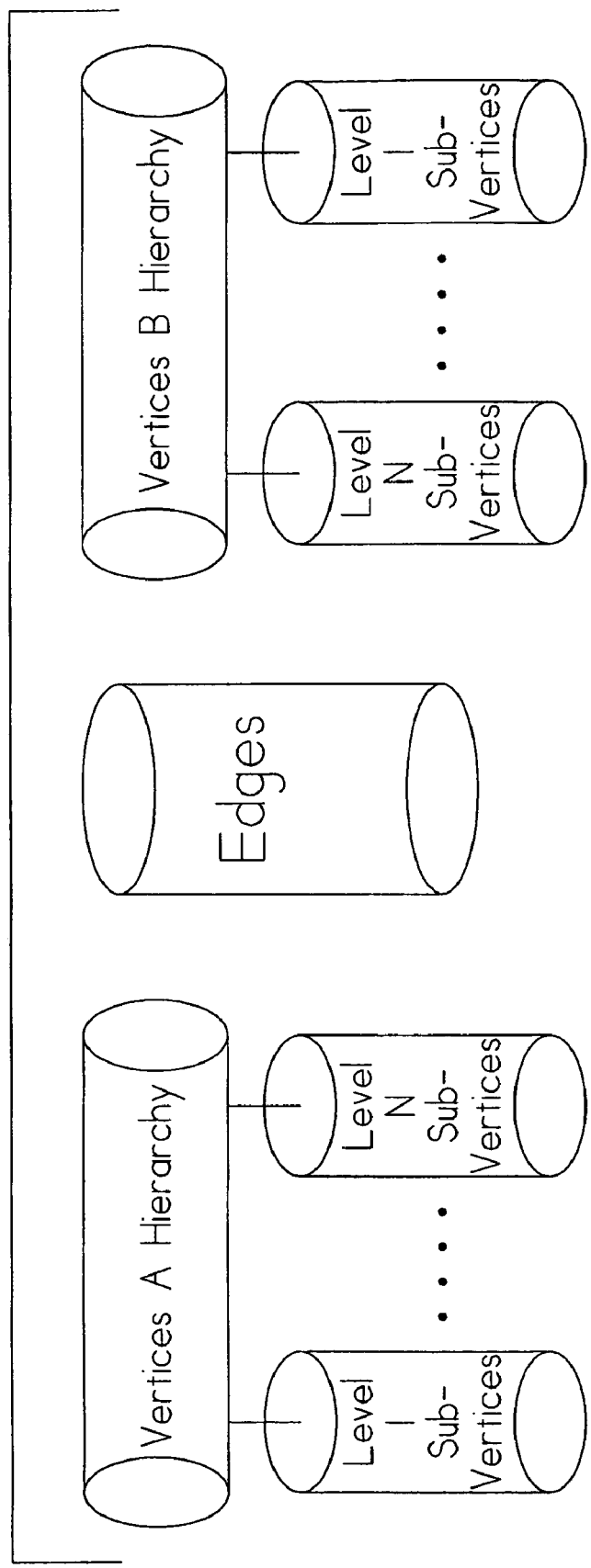
FIG. 7 is a diagram showing HBG object implementation.

FIG. 7 shows the main HBG object. The program which uses the HBG instantiates an HBG object and performs operations on it. All of the necessary information is stored in the list of edges. This edge list is serialized to and from disk. The vertex hierarchies and sub-vertex lists are created from the edge list.

The list of edges is stored as a sorted, balanced tree, allowing logarithmic access. The vertex hierarchies are stored as an array, allowing direct access to any hierarchy level. The sub-vertex lists are stored as sorted, balanced trees, allowing logarithmic access.

Figure 8:
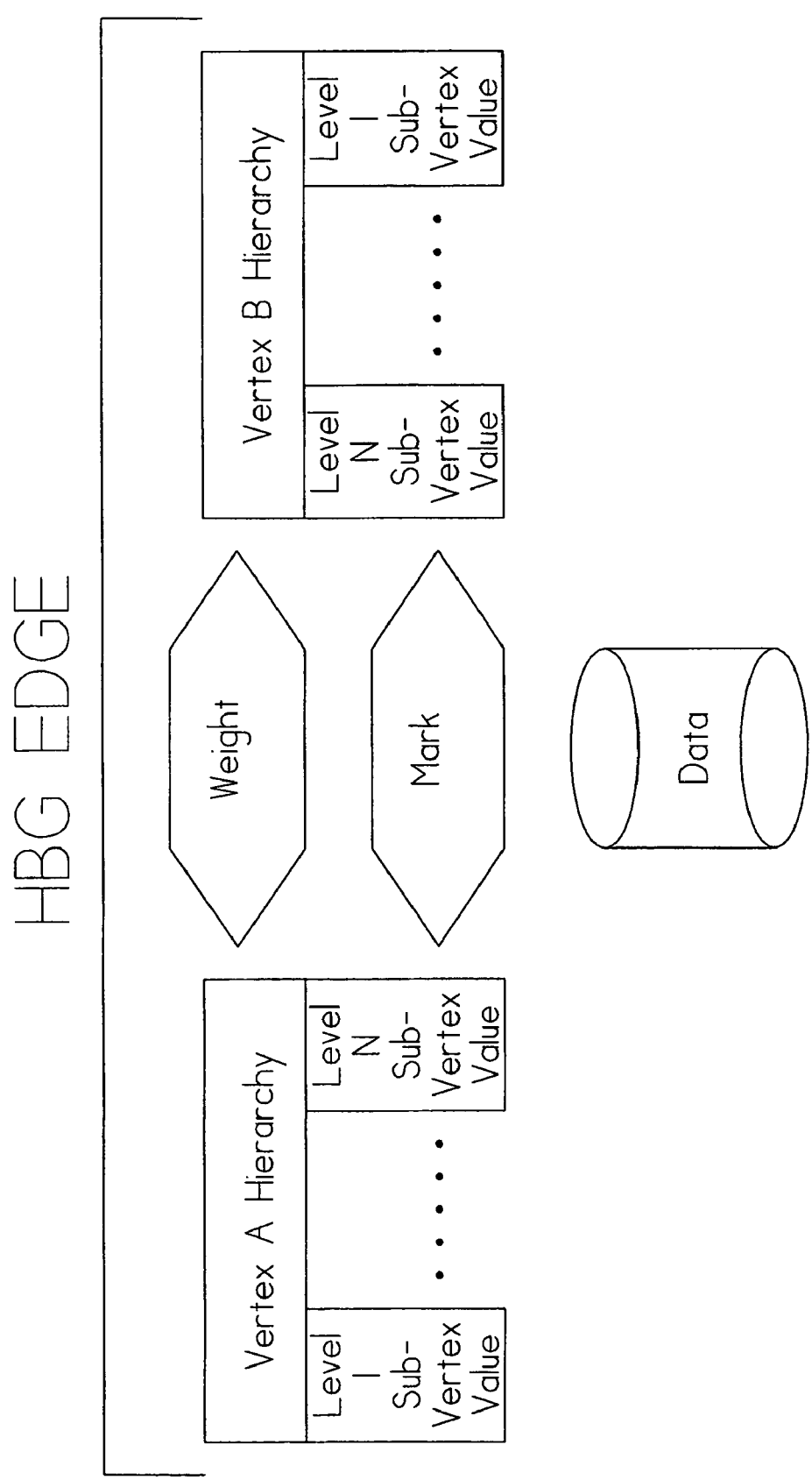
FIG. 8 is a diagram showing HBG edge implementation.

FIG. 8 is a diagram showing the HBG edge object. It contains an array (direct access) of sub-vertex values for each vertex hierarchy. It contains a weight and a mark, which are used in graph algorithms. It also contains optional extra data. This allows special information to be stored with the edges of an HBG for use by other programs. The sub-vertex values (and optionally the weight) are used for sort keys. The user can redefine the order in which the hierarchy levels are sorted. All edges in a given HBG object must have the same hierarchy level structure in the preferred mode which greatly simplifies and increases efficiency of processing.

Figure 9:
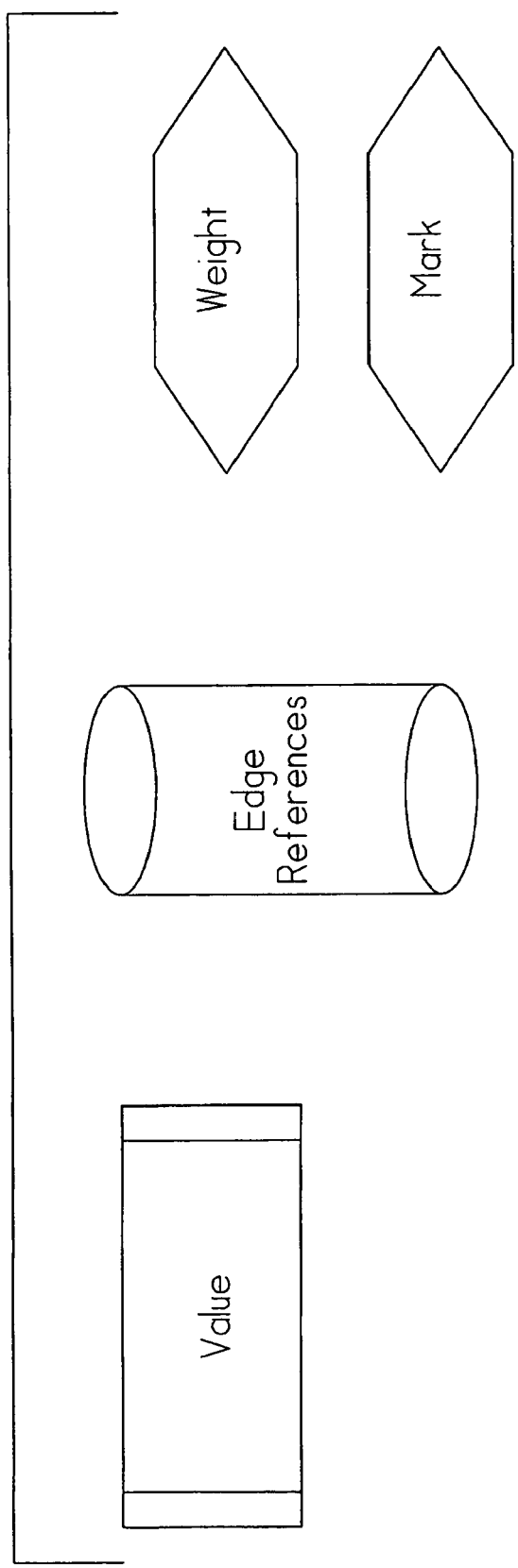
FIG. 9 is a diagram showing HBG sub-vertex implementation.

FIG. 9 is a diagram showing the HBG sub-vertex object. It holds the value, which is currently stored as a 64-bit unsigned integer. This allows the sub-vertex to take on 18,446,744,073,709,551,616 (18 quintillion) different values, which is enough for current applications. The value type could be any numerical or object type in alternate implementations. The value is used as the sort key. Like the edge, it also contains a weight and a mark for use in graph algorithms. Each sub-vertex also contains a sorted, balanced tree of references to all the edges that touch this sub-vertex value. This significantly simplifies the graph algorithms.

All of the high-level graph operations are exposed through the HBG Console utility. All these operations can also be performed directly on an HBG object in program code. Additionally, they can be performed with direct edge objects and lists and vertex values and lists, as well as with edges and vertex values loaded from files. Also, the HBG object has built-in operations for removing marked edges and marked vertices. These allow specification of which marks to remove and to reset the other marks. It is useful for programs that implement their own low-level graph algorithms.

Figure 10:
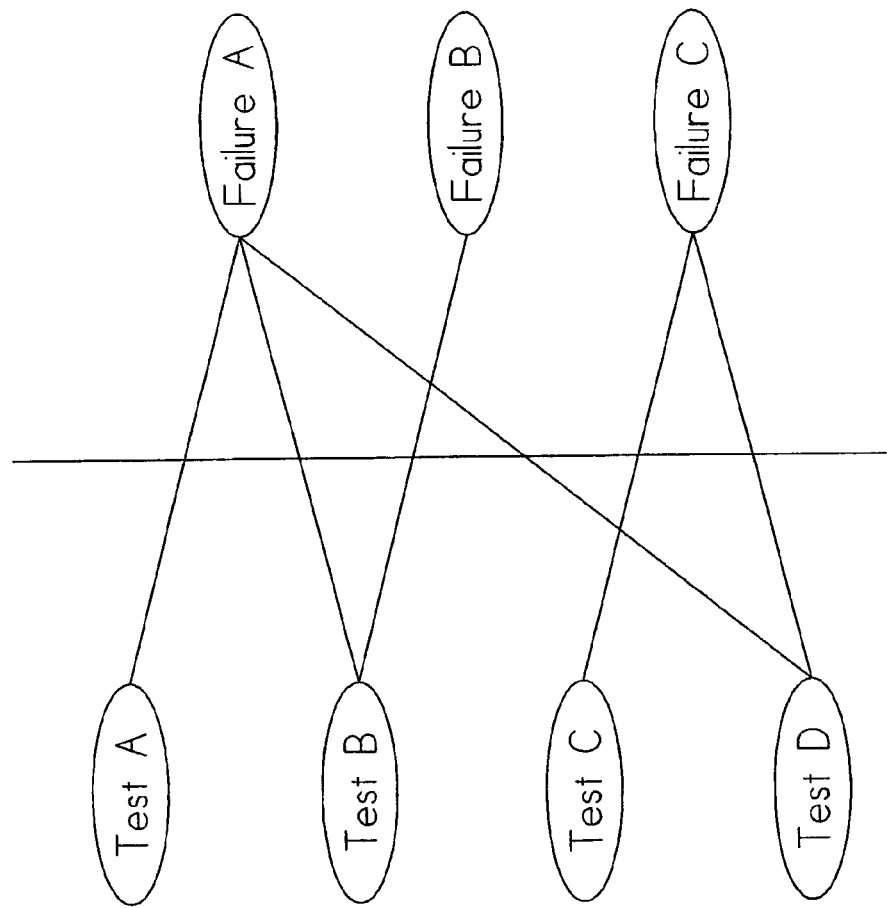
FIG. 10 is a diagram showing an original HBG database that will undergo Min-Max picking.

FIG. 10 is a visual representation of the original HBG as presented to the Min-Max Picking process. It is assumed that HBG includes only test entries of interest. Operations within the TestPicker suite can be used to obtain this initial subset of test entries based on user constraints and HBG database queries. Test picking is accomplished via the min-max algorithm. It finds the minimum number of Vertex-A's (test/stress combinations) that cover the maximum number of Verte-B's (failures) Some of the algorithms are optimal for different coverage requests. However, for significantly less computation time, some of the greedy algorithms give results extremely close to optimal results, many of which are locally optimal.

Figure 11:
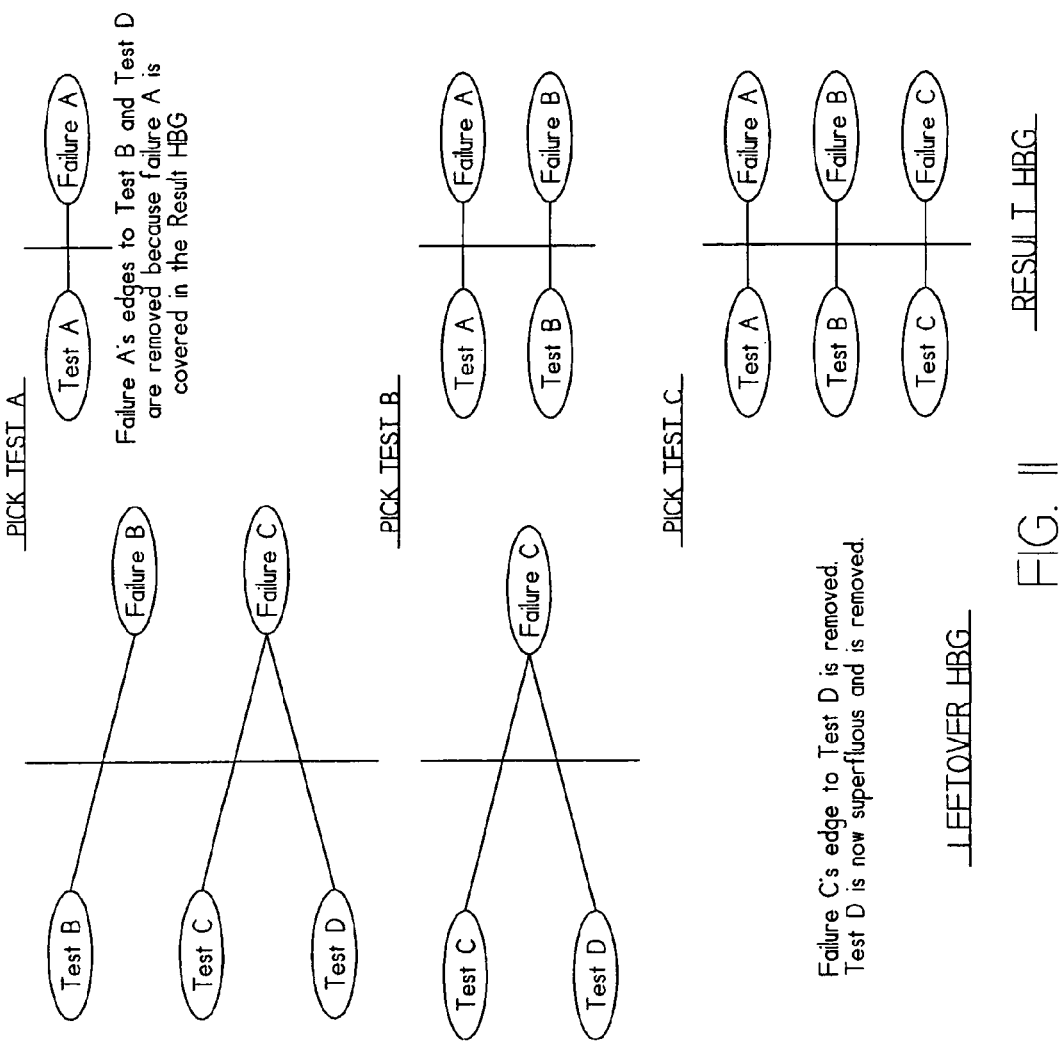
FIG. 11 is a diagram showing a simple algorithm for Min-Max picking using the original HBG.

FIG. 11 is a diagram showing how a subset of Vertex-A's that covers Vertex-B's is selected. The first example uses a fast, easy algorithm for picking Vertex-A's.

The unique_tests program is actually one type of test picking algorithm specifically adaptable to the present invention. The min-max algorithms shown herein do not directly take into account runtime or the number of instruction processor, though, unique_tests does. These algorithms and programs will work on any HBG.

Figure 12:
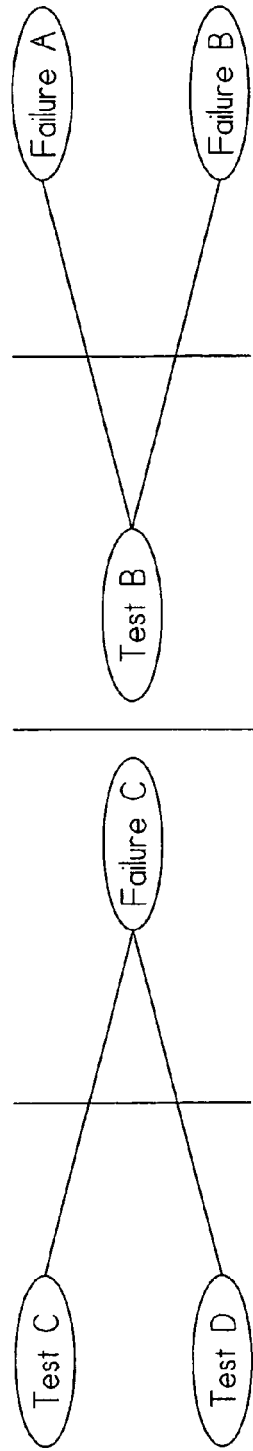
FIG. 12 is a diagram showing an optimal algorithm for Min-Max picking using the original HBG.
Figure 12:
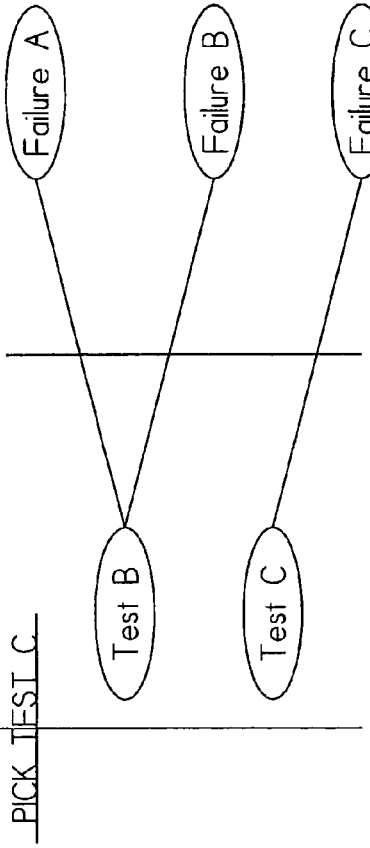

FIG. 12 is a diagram which operates on the same HBG example except that an optimal algorithm is used, resulting in the minimum possible set of Vertex-A's that covers all the Vertex-B's.

The min_max program implements several algorithms of "picking" a minimum number of Vertex-A's (test/stress combinations" that cover the maximum number of Vertex-B's (failures) in the data base. For all algorithms, all the chosen test/stress combinations will be unique. That means that each test/stress combination covers at least one failure and that no other chosen test/stress combination covers that same failure. This is called a unique set. The resulting data base has no duplicate Vertex-A's or Vertex-B's (no two-edges will have the same Vertex-A or Vertex-B).

Having thus described in detail the preferred embodiments of the present invention, those of skill in the art will be readily able to apply the teachings found herein to yet other embodiments within the scope of the claims hereto attached.

I claim:

1. An apparatus for efficiently preparing tests for finding errors within a simulated digital circuit design comprising:
   a. a random test generator which automatically generates a first plurality of test cases;
   b. a simulator which applies said plurality of test cases to said simulated digital circuit design and produces a first plurality of results wherein each of said plurality of results corresponds to a different one of said first plurality of test cases; and
   c. a test picker which selects a second plurality of test cases from and smaller than said first plurality of test cases by eliminating certain of said first plurality of test cases for which a first of said plurality of results corresponding to said different one of said first plurality of test cases is similar to a second of said plurality of results corresponding to said certain of said first plurality of test cases.

2. The apparatus according to claim 1 wherein each of said plurality of test cases further comprises a description of successful result.

3. The apparatus according to claim 2 wherein said each of said first plurality of results indicates either a pass or failure.

4. The apparatus according to claim 3 wherein each of said first plurality of results having indication of failure further comprises a description of reason for failure.

5. The apparatus according to claim 4 wherein equivalence of said description of reason of failure causes said eliminating certain of said first plurality of test cases for which said first of said plurality of results corresponding to said different one of said first plurality of test cases is similar to said second of said plurality of results corresponding to said certain of said first plurality of test cases.

6. A method of generating an ordered sequence of test cases for a simulated digital logic design comprising:
   a. generating a list of test cases;
   b. executing said list of test cases by said simulated digital logic design;
   c. recording a result of said executing step for each of said test cases;
   d. comparing said result of said executing step for each of said test cases;
   e. modifying said list of test cases by eliminating certain ones of said test cases for which said comparing step determines similarity; and
   f. repeating steps a-e.

7. The method according to claim 6 wherein each of said test cases further comprises an indication of success.

8. The method according to claim 7 wherein said recording step includes an indication of pass or failure based upon said indication of success.

9. The method according to claim 8 wherein said recording step further comprises recording a reason for failure for each of said test cases having said indication of failure.

10. The method according to claim 9 wherein said comparing step further comprises comparing said reason for failure for each of said test cases having said indication of failure.

11. An apparatus for preparing an efficient list of test conditions to find errors within a simulated logic circuit comprising:
   a. generating means for generating said list of test cases;
   b. executing means for executing each of said list of test cases;
   c. recording means responsively coupled to said executing means for recording a result for said executing each of said list of test cases; and
   d. deleting means responsively coupled to said recording means and said generating means for deleting particular ones from said list of test cases based upon said result for said executing each of said list of test cases to produce said efficient list of test cases.

12. The apparatus according to claim 11 wherein said executing means further comprises executing said list of test cases within said simulated logic circuit.

13. The apparatus according to claim 12 wherein said list of test cases means further comprises indicating means for indicating success.

14. The apparatus according to claim 13 wherein said result further comprises means for indicating pass of failure of an individual test case based upon corresponding success indicating means.

15. The apparatus according to claim 14 wherein said deleting means deletes said particular ones based upon said success indicating means.

16. A method of testing a logic circuit comprising:
   a. preparing a plurality of test cases;
   b. assigning a success indicator to each of said plurality of test cases;
   c. executing each of said plurality of test cases to produce a plurality of corresponding results;
   d. comparing each of said plurality of corresponding results to said success indicator;
   e. determining pass or failure of each of said plurality of test cases based upon said comparing step;

f. deleting selected ones of said plurality of test cases to produce a list of test cases; and g. executing each of said list of test cases.

17. The method according to claim 16 wherein said determining step further comprises recording said plurality of corresponding results.

18. The method according to claim 17 wherein said recording step further comprises providing a reason for failure for each of said plurality of test cases determined to be a failure.

19. The method according to claim 18 wherein said deleting step further comprises comparing said reason for failure for each of said plurality of test cases.

20. The method according toe claim 19 wherein said deleting step further comprises deleting said selected ones of said plurality of test cases which do not have a unique reason for failure.

\* \* \* \* \*